(12) United States Patent
Coffey

(10) Patent No.: US 6,281,759 B1
(45) Date of Patent: *Aug. 28, 2001

(54) DIGITAL FREQUENCY GENERATION METHOD AND APPARATUS

(75) Inventor: Anthony Coffey, Swindon (GB)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,774

(22) Filed: May 28, 1998

(30) Foreign Application Priority Data

May 30, 1997 (GB) .................................... 9711206

(51) Int. Cl.⁷ ...................................... H03B 5/02
(52) U.S. Cl. .............................. 331/57; 331/1 A; 331/25; 331/45; 327/158; 327/159
(58) Field of Search .............................. 331/57, 25, 1 A, 331/45, 49, 74; 327/291, 298, 299, 158, 159, 160

(56) References Cited

U.S. PATENT DOCUMENTS

| 4,684,897 | 8/1987 | Richards et al. . |
| 5,068,628 | 11/1991 | Ghoshal . |
| 5,394,116 | * 2/1995 | Kasturia ................................. 331/34 |
| 5,854,576 | * 12/1998 | Swan ...................................... 331/57 |

FOREIGN PATENT DOCUMENTS 0 403 990 A2   12/1990   (EP) .
0 516 379 A2   12/1992   (EP) .

* cited by examiner

*Primary Examiner*—Arnold Kinkead

(57) ABSTRACT

A method and a circuit are described for generating a frequency signal having fine frequency control, and which are suitable for implementation on an-integrated circuit. The output frequency is generated having a controllable relationship with an oscillator frequency by using multiple phases of the oscillator signal. The output is provided by selecting a signal from the plurality of phases, and the frequency control is achieved by varying the selection cyclically, so that the output signal may be composed of segments of different phases. The cyclic selection is performed at a controllable rate to achieve stable generation of an original frequency signal.

55 Claims, 3 Drawing Sheets

DIGITAL FREQUENCY GENERATION METHOD AND APPARATUS

FIELD OF THE INVENTION

This invention relates to a digital frequency generation method and apparatus. The invention is particularly suitable for use to generate a pulse signal, such as a clock signal, but it is not limited exclusively to this. The invention is also particularly suitable for implementing on an integrated circuit, but again, the invention is not limited exclusively to this.

BACKGROUND OF THE INVENTION

There are many applications for which a controllable or variable frequency generator is needed, for example, in mobile communications (mobile telephones), or when it is desired to synchronise two circuits. Other applications include data and clock recovery (when it is desired to generate a clock signal synchronised to a data stream which may include dither).

Particular problems can arise when it is desired to generate an original pulse signal having a frequency which is controllable very finely, for example, in very fine frequency steps. Generally, digital oscillators having a fixed frequency can be implemented relatively easily, for example, based on a crystal or other high Q circuit, but it is difficult to produce a controllable output frequency other than the crystal frequency (or integer division multiples thereof).

Fine frequency control has been achieved digitally using oversampling techniques such as direct digital synthesis, and using phase locked loops. However, direct digital synthesis techniques suffer from the disadvantage that they require an original clock frequency which is very much higher than the output frequency. Moreover, direct digital synthesis requires fairly complex circuitry to implement.

As an example, FIG. 1 illustrates a general circuit for direct digital synthesis. The output waveform is stored in a read only memory (ROM) 10, which is addressed by a phase address register 12. Each time a clock pulse is received from the fixed frequency oscillator 14, the value in the address register 12 is updated by the adder 16 incrementing the current address value by a phase increment value stored in increment register 18. The digital output from the ROM 10 is converted to an analogue signal by an output digital to analogue converter (DAC) 20.

The output frequency depends on the number of address bits in the adder 16, the increment value stored in register 18, and the fixed clock frequency. Frequency control is achieved by varying the increment value stored in register 18, the smallest frequency step achievable being dependent generally on N/F where N is the number of bits in the adder, and F is the fixed frequency. Fine frequency control is obtainable only by using an overly high fixed frequency F, and a relatively high number of arithmetic adder bits N. This requires the use of high speed arithmetic circuitry.

SUMMARY OF THE INVENTION

The present invention has been devised bearing the above problems in mind.

In contrast to the prior art, one aspect of the present invention is to generate an output frequency which has a controllable relationship with an oscillator frequency by using multiple phases of the oscillator signal. The output is provided by selecting a signal from the plurality of phases, and the frequency control is achieved by varying this selection cyclically, so that the output signal may be composed of segments of different phases.

Each time the selection is changed, the period between a pulse of the preceding segment and a pulse of the new segment will be different from the basic period of each phase (i.e. either longer or shorter than the basic period). By controlling the rate at which the different phases are repetitively selected, an output signal can be generated having an effective frequency different from the basic oscillator frequency.

An important advantage of this invention is that it does not require a oscillator frequency which is much higher than the frequency desired to be generated. The generator can output a controlled frequency which is close to the oscillator frequency. Also, multiphase oscillators can be implemented very easily, for example, on an integrated circuit.

Multi-phase oscillators have been used hitherto in data/clock recovery applications, although not for original frequency generation. An example of such an application is illustrated in FIG. 2. The different phase outputs 22 from a inulti-phase oscillator 24 are fed to a selector switch 26 which is operable to select one of the multiple phase signals 22 as the final output 28. The switch 26 is controlled by an up/down counter 30, the value held in the counter controlling which of the multi-phase signals 22 is selected by the switch 26.

The output 28 is synchronised relative to an incoming pulse signal 32 by means of a phase detector 34 and a loop filter circuit 36, the output of which controls the up/down counter 30. The circuit attempts to correct phase differences between the output signal 28 and the incoming signal 32, by selection of the multi-phase output signals 22. If the generated output 28 leads the incoming signal 32, then the counter 30 is controlled to decrement the count value, to thereby control the selector switch 26 to select a respective one of the multi-phased signals 22 having a phase lag. Similarly, if the output signal 28 is lagging behind the incoming signal 32, then the counter 30 is controlled to increment its count value, to thereby control the selector switch 26 to select a respective one of the multi-phased signals 22 with a more advanced phase.

The above circuit is only effective when the frequency of the incoming signal 32 is the same as, or very close to, the fixed frequency of the oscillator 24. If the frequencies are slightly different, then the circuit will tend to cycle through the multi-phase outputs to minimise the phase difference.

The circuit of FIG. 2 may be regarded as simply as an "aligner" for aligning the output from the oscillator 24 with an incoming pulse signal 32. The output 28 simply mimics a clock signal to match the incoming pulse signal 32. Therefore, such a circuit is not suitable as a stand-alone, or original, frequency generator because it relies on receiving an input pulse train having the same characteristic frequency as that to be generated.

To the best of the inventor's knowledge, the technique of cyclically selecting the outputs from a multi-phase oscillator has not hitherto been used for original frequency generation.

In one specific aspect, the invention provides a digital frequency generator, comprising:

an oscillator circuit with means for producing multiphase output pulse signals;

switch means for outputting a selected signal from the plurality of multiphase pulse signals from the oscillator circuit; and cyclic selection means driven by a signal from the oscillator circuit or from the switch means, and operable to control the switch means to vary cyclically the selection of the signal used as the output signal, to thereby generate an output signal having a frequency different from the oscillator frequency.

In a closely related aspect, the invention provides a method of digital frequency generation, comprising:

generating a plurality of multi-phase pulse signals all having a common predetermined frequency; and cyclically selecting at a controllable or predetermined rate, different ones of the multi-phase pulse signals for output, to thereby generate an output signal having a frequency different from the oscillator frequency.

BRIEF DESCRIPTION OF THE DRAWINGS

Embodiments of the invention are now described by way of example only, with reference to the accompanying further drawings, in which.

DESCRIPTION OF THE PREFERRED EMBODIMENTS

Figure 1:
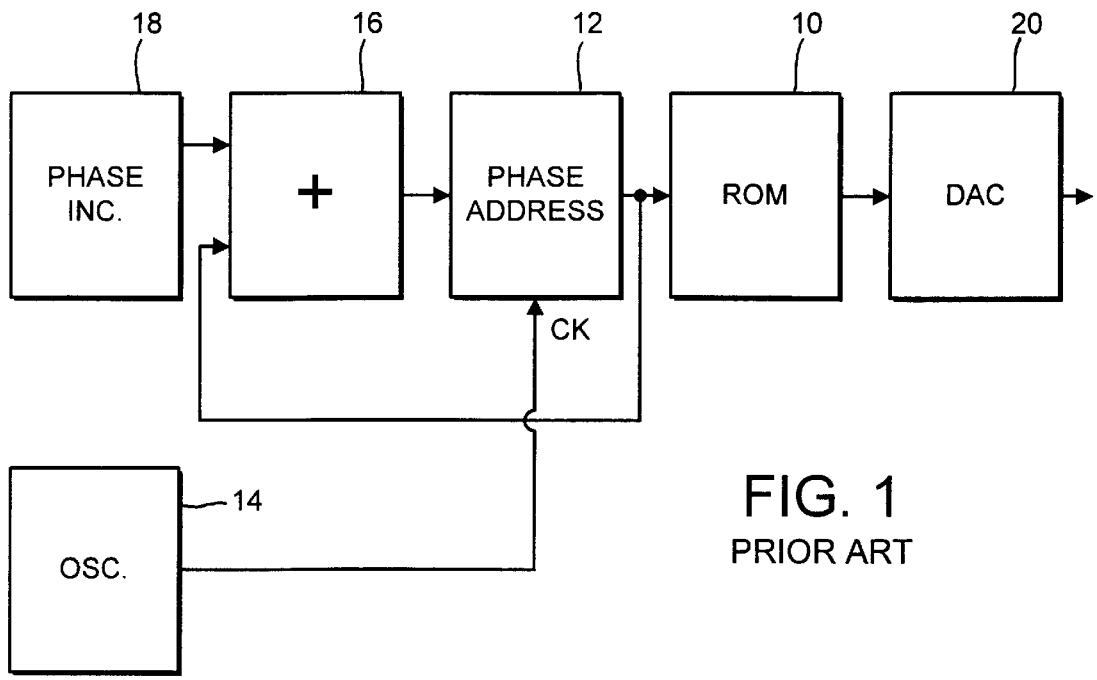
FIGS. 1 and 2 are schematic block circuit diagrams showing two prior art arrangements.
Figure 2:
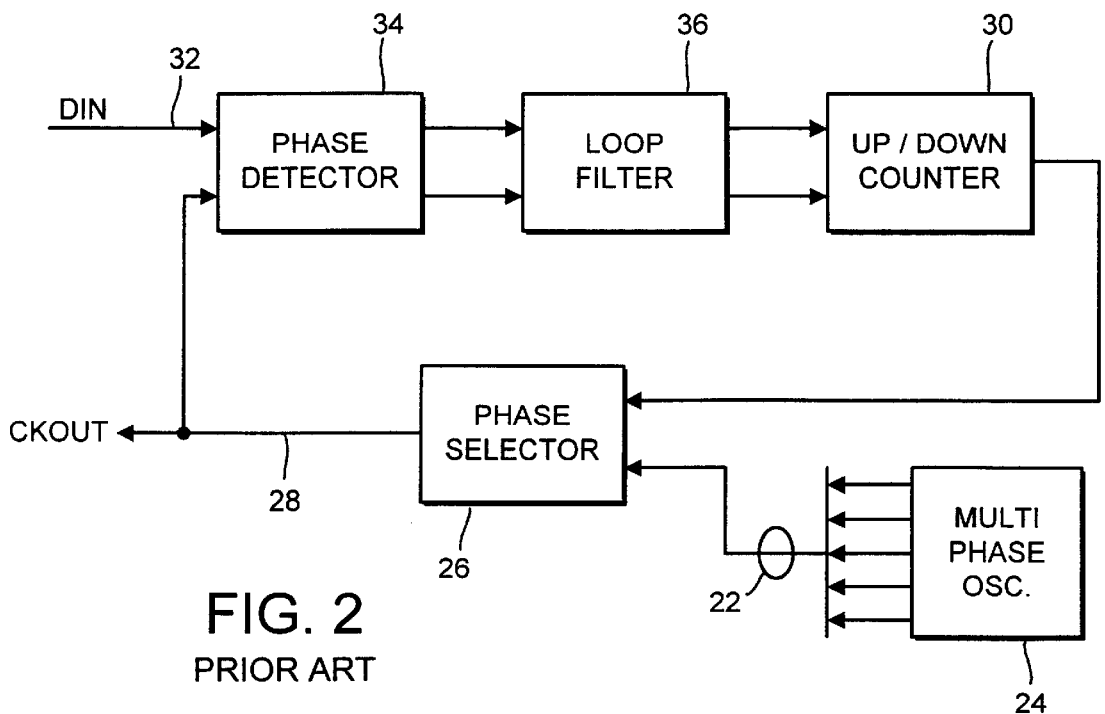
Figure 3:
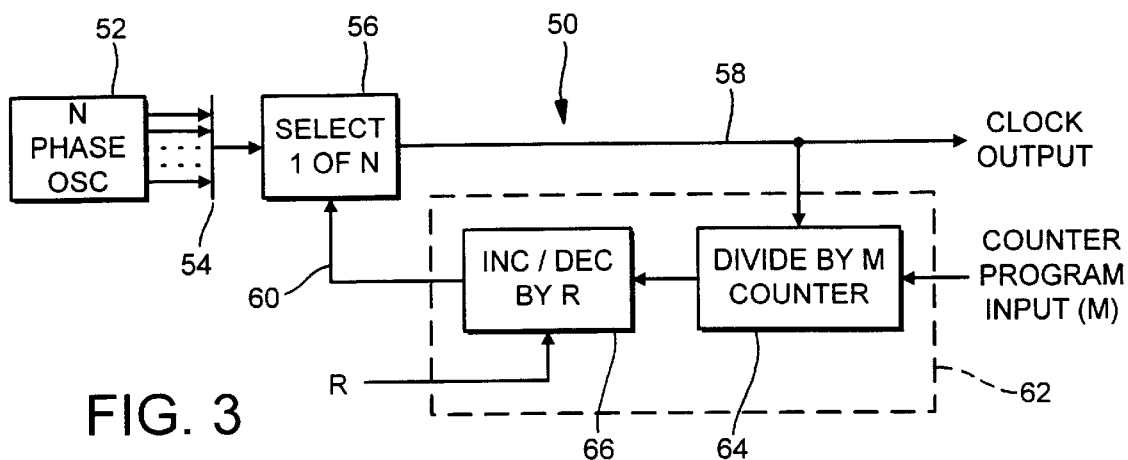
FIG. 3 is a schematic block circuit diagram of an embodiment of the present invention.
Figure 4:
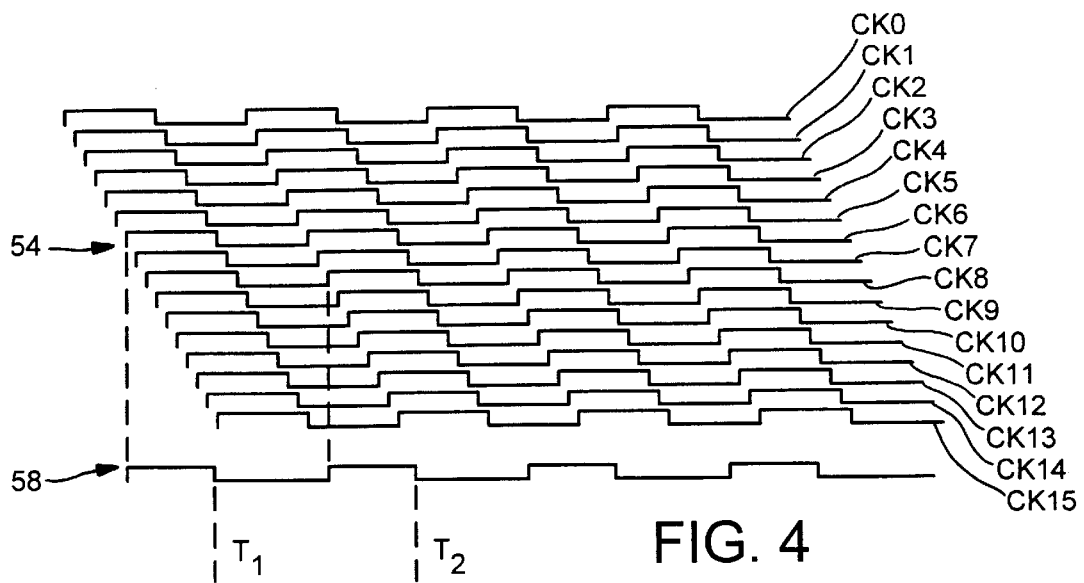
FIG. 4 is a timing diagram showing the principle of signal selection.

Referring to FIG. 3, a frequency generator 50 implemented on an integrated circuit comprises an oscillator 52 producing multi-phase outputs 54. Generally, the oscillator will operate at only a predetermined frequency, which may be governed by one or more external elements, such as a crystal (not shown). The oscillator has N outputs, each of which is separated by a phase difference of 360°/N from adjacent phase outputs. In the present embodiment, the number of outputs N is 16, so that the outputs are separated by a phase angle of 22.5°. The signals are illustrated in FIG. 4, and are labelled CK(n), where n is 0, 1, 2, . . . 15.

The N outputs 54 are fed as inputs to a selector switch 56 having a single output 58. The switch 56 is operative to couple a selected one of the multi-phase signals 54 to the output 58, the signal being selected in accordance with a control signal 60 to the switch 56. The input 60 represents a number (between 0 and 15) corresponding to the respective multi-phase input to be selected.

In use, the selector switch 56 is controlled by a circuit (denoted by broken line 62) to vary cyclically the selection of the multi-phase signals 54 for the output 58. In this embodiment, the circuit 62 is clocked by the output 58, and includes a first divide-by-N counter 64 and a second increment/decrement-by-R produce the control signal 60. The control signal cycles the selection of the multi-phase signals 54 at a rate dependent on the ratio R/M.

In more detail, the first counter 64 produces a single output pulse to the second counter 66 for every M pulses generated on line 58. For each pulse generated by the first counter 64, the second counter 66 is incremented (or decremented) by the value R to output a new count value. Each time that that the second counter 66 cycles through 0 or 15, the count value is reset to perform modulo counting.

In general, the frequency Fou- on the output line 58 will be:

$$F_{OUT} = \left[ \frac{N}{N \pm \left(\frac{R}{M}\right)} \right] \times F_{IN}$$

where $F_{in}$ is the frequency of the oscillator 52.

In the above formula, the ±operation depends on whether the second counter 66 is arranged to increment, or decrement, by the value R. In the illustrated embodiment (see also FIG.4), the signals 54 include a progressive phase lag with increasing n. For example, CK1 lags behind CK0 by 22.5° C., and CK2 lags behind CK1 by a further 22.5° C. Therefore, if the second counter 66 increments the count value (i.e. the "+" operation in the above formula), successively selected phases will lag each other, leading to a reduction in the output frequency. Conversely, if the second counter 66 decrements the count value (the "−" operation in the formula), successively selected phases will lead each other, resulting in the output frequency being higher than the input frequency.

FIG. 4 illustrates a simple timing diagram for the frequency generator when M=1 and R=+2 (the + sign indicating that the second counter 66 will increment the count value). The second counter 66 will initially hold an arbitrary value, say 6, such that the initial phase signal 54 selected for output will be CK6.

With the value M set to 1, the first counter/divider 64 is transparent and pulses are passed from the output 58 directly to the input of the second counter 66.

The falling edge transition of CK6 (at time $T_1$) triggers the second counter 66 to increment the current counter value by R, to 8. This value is passed as the control input to the selector switch 56 at time $T_1$ (or very shortly thereafter). Thus, after the point $T_1$, the output signal 58 will consist of a signal segment from CK8. Similarly, the falling edge transition of CK8 (at time T2) triggers the second counter 66 again to increment the current counter value by R, to 10. Thus, after the point T2, the output signal will consist of a signal segment from CK10. The output signal will have an effective frequency of (16/18)×Fin.

It will be appreciated that the provision of two counters 64 and 66 in this embodiment, the first as a divider and the second as a multiplier, enables the output frequency to be controlled according to the ratio R/M, which provides excellent versatility of frequency selection.

In this embodiment, the counters 64 and 66 are each programmable, so that appropriate values of M and R, respectively, can be set. However, in other embodiments one or both of these counters may be have a fixed value of M or R. In particular, the second counter 66 may be an increment only, or a decrement only, counter. Also, if the desired value of M is 1, then the first counter 64 may be omitted altogether.

In this embodiment, the multi-phase signals 54 are coupled in a uniform sequence CK0, CK1, CK2, . . . CK15 to the inputs of the selector switch 56, so that they can be selected in order. However, in other embodiments, the multi-phase signals 54 may be arranged in a different order, for example, to generate higher frequencies. Such different ordering is merely equivalent to a different switching order by the selector switch 56, but may be used to simplify the counters 64 and 66 to be used.

In this embodiment, the multi-phase signals 54 are separated by a generally uniform phase increment. This is advantageous in enabling fine frequency control. However, in other embodiments, a non-uniform phase increment might be used.

In FIG. 3, the control circuit 62 is driven from the output 58. Alternatively, the circuit 62 may be driven by a different signal derived from the oscillator 52. For example the circuit 62 may be driven directly by one of the multi-phase signals 54. An important feature of this embodiment is that the selector switch 56 be driven by an "internal" signal of the frequency generator, rather than by an external reference signal having the same frequency characteristic as that desired. It is this property which enables the circuit to generate an original frequency, and distinguishes the circuit from an aligner as described earlier.

Figure 5:
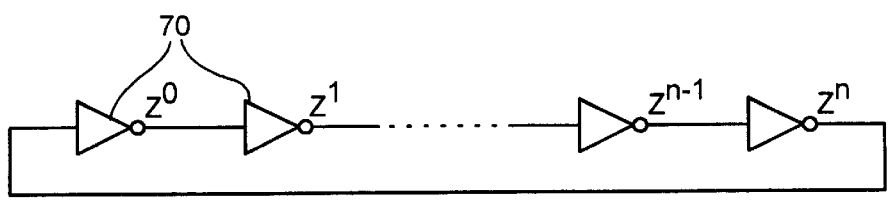
FIG. 5 is a schematic block circuit diagram of a basic first embodiment of a multi-phase ring oscillator.

Any suitable oscillator 52 having multi-phase outputs 54 may be used as desired. FIG. 5 illustrates a simple form of ring oscillator which may be used. In FIG. 5, the oscillator 52 consists of a number N of gates 70 coupled in a continuous cascade arrangement, with the input of each gate being driven by the output of the preceding gate in the ring. Provided that the requirements are met for oscillation, such a ring circuit would oscillate at a basic frequency of Fosc= 1/(N×Td) where Td is the propagation delay of each gate. Each gate produces an output which is delayed in to phase relative to the preceding gate. In the circuit illustrated, the gates 70 are inverter gates, and so adjacent gates would also include an additional 180° phase difference. (If necessary an additional gate (not shown) would be included to produce the net phase feedback phase change need for oscillation). For example, for 16 gates labelled G0 to G15, the multi-phase outputs illustrated in FIG. 4 would be produced as follows:

G0–CK0
G1–CK9
G2–CK2
G3–CK11
G4–CK4 . . .
G7–CK15 . . .
G15–CK7

Although the circuit illustrated in FIG. 5 is simple, it is not generally suitable for implementing in an integrated circuit because the oscillation frequency is not very stable. The propagation delay Td depends on many factors, including temperature, and may be subject to power supply noise.

To make such an oscillator controllable and of sufficient quality for most no applications, the "ring" may be placed in a feedback loop such as a phase-locked loop. However, this is not the only means of achieving stability. A technique which is particularly suitable for implementing a multi-phase oscillator on silicon, can provide many phases, and has other advantages such as good supply rejection, is to use differential controllable delay elements in a phase locked loop. The delay of the elements may be controlled by voltage, current or charge.

Figure 6:
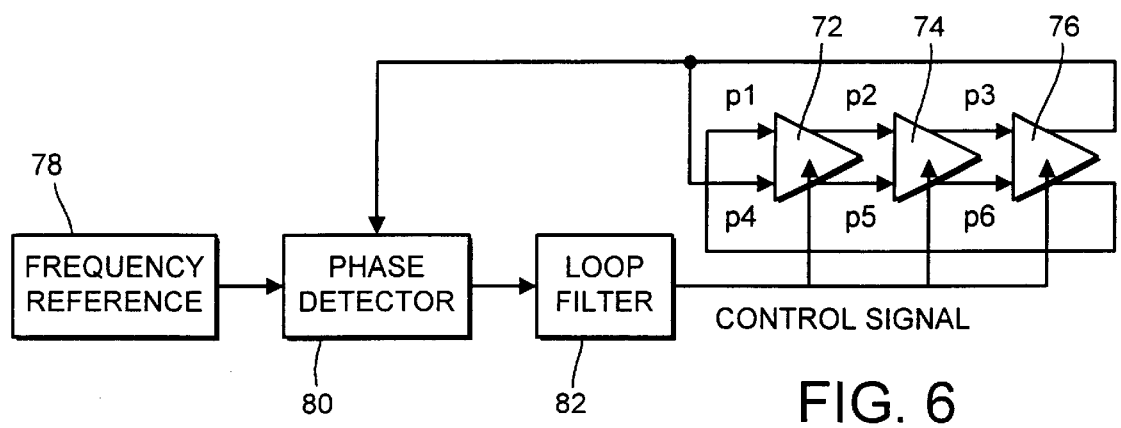
FIG. 6 is a block schematic circuit diagram of a second embodiment of multi-phase oscillator.

Such a circuit is illustrated in FIG. 6. For the sake of brevity, a six-phase oscillator is illustrated. In FIG. 6, the oscillator "ring" is formed by three voltage controllable delay elements 72, 74 and 76 each having differential inputs and outputs. The outputs of the first delay element 72 are coupled to the inputs of the second delay element 74, whose outputs are, in turn, coupled to the inputs of the third delay element 76. The outputs of the third delay element 76 are coupled in antiphase to the inputs of the first element 72 to complete the ring. Each element 72, 74 and 76 produces two opposite phase output signals, and it is assumed for fine frequency control applications that the delay Td, and therefore the phase increment, is the same in each delay element. For example, the first delay element 72 can produce the opposite phase signals CK0 and CK3 of a six phase output, the second delay element 74 can produce CK1 and CK4, and the third delay element 76 can produce CK2 and CK5.

The phase locked loop includes a reference oscillator 78, a phase detector 80 for comparing the ring output to the reference oscillator output, and a loop filter 82. The output of the loop filter 82 is a voltage control signal for controlling the delay of the elements 74, 76 and 78.

Figure 7:
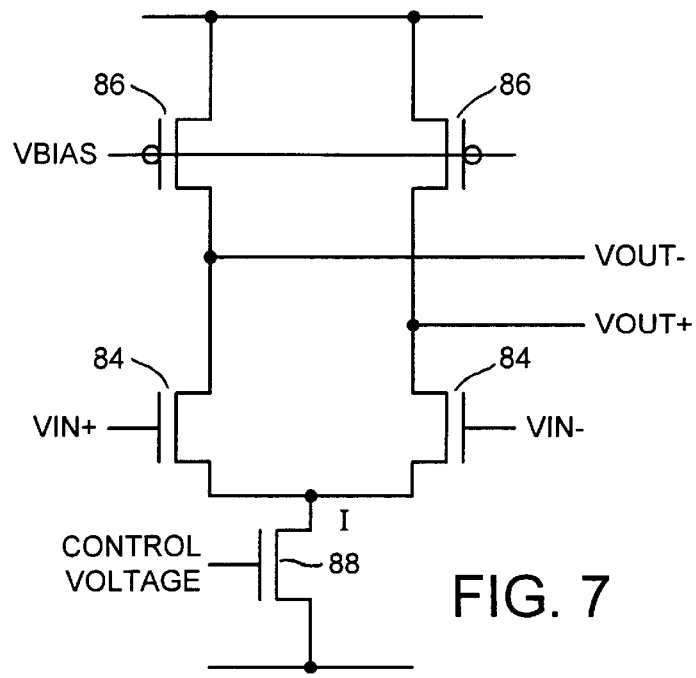
FIG. 7 is a schematic circuit diagram of a delay element used in FIG. 6.
Figure 8:
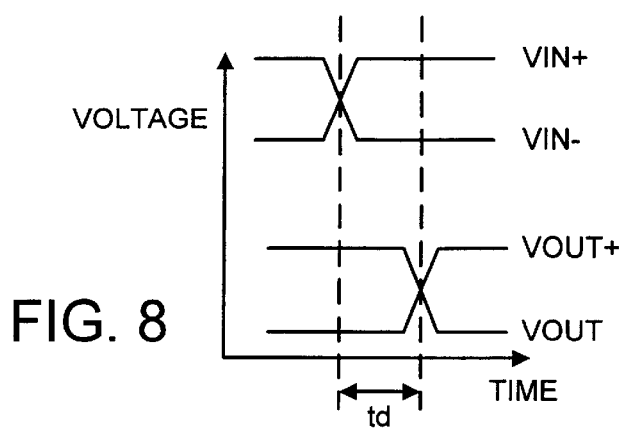
FIG. 8 is a timing diagram showing operation of the delay element of FIG. 7.

FIG. 7 illustrates an example of a CMOS differential delay element for use in the circuit of FIG. 6. The delay element consists of a pair of CMOS transistors 84 in a differential long tailed pair configuration with respective bias transistors 86. The current through the transistors 84 is regulated by a fifth transistor 86, and is controlled by the voltage applied to the gate of the fifth transistor. The controllable delay results from the gate capacitance of the differential transistors 84. If the gate capacitance is C, then, when an input transition occurs, the rate of change of will be:

$$\frac{dV_{OUT}}{dt} = \frac{I}{C}$$

Thus, the switching speed of the transistors 84 is proportional to the current I, and reducing the current can increase the effective switching delay introduced by the transistors.

Although the circuit of FIG. 7 is a CMOS circuit, the same basic circuit can be implemented in almost any technology.

The present invention, particularly as described in the preferred embodiments, can provide a controllable and stable digital frequency generator, which can be suitable for implementing in a variety of integrated circuit technologies, requires only relatively straightforward circuitry, and can avoid the need for a very high speed clock. In particular, fine frequency control can be achieved even at frequencies close to the clock frequency. There are many applications for the invention include data and clock recovery, and frequency synthesis or generation, for example, for telecommunications (such as mobile telephones).

It will be appreciated that the above description is merely illustrative of a preferred form of the invention, and that many modifications may be made without departing from the invention.

Although features believed to be of particular importance have been set out in the appended claims, the Applicant claims protection for any novel feature or combination of features described herein and/or illustrated in the drawings, irrespective of whether emphasis has been placed thereon.

What is claimed is:

1. A digital frequency generator, comprising:

an oscillator circuit having at least one internal component which produces multiphase signals;

a multiplexor for outputting a selected signal from the multiphase signals from the oscillator circuit; and a cyclic selection circuit driven by the selected signal and operable to control the multiplexor to vary cyclically the selection of the multiphase signals used as the selected signal, to thereby generate a clock output signal having a frequency different from the oscillator circuit frequency;

wherein the output signal frequency $F_{OUT}$ is related to the oscillator circuit frequency $F_{OSC}$ by:

$$F_{OUT} = \left(\frac{N}{N \pm \left(\frac{R}{M}\right)}\right) \times F_{OSC}$$

where M and R are non-zero integers, and N =number of phases of said multiphase signals.

2. The digital frequency generator of claim 1, wherein the cyclic selection circuit comprises at least one divider circuit.

3. The digital frequency generator of claim 2, wherein the divider circuit is operable to divide a received pulse rate by a programmable value.

4. The digital frequency generator of claim 1, wherein the oscilator circuit comprises a phase locked loop.

5. The digital frequency generator of claim 1, wherein the oscillator circuit comprises a ring, oscillator, the ring, oscillator including a ring of controllable delay elements.

6. The digital frequency generator of claim 5, wherein the controllable delay elements have differential inputs and outputs.

7. The digital frequency generator of claim 1, wherein the cyclic selection circuit comprises a register for storing a value representing a respective signal to be selected by the multiplexor, and a circuit operable to increment and/or decrement the value stored in the register by a programmable value, wherein said programmable value is a non-zero integer.

8. The digital frequency generator of claim 1, wherein the cyclic selection circuit comprises a circuit for generating a periodic trigger signal from the output of the multiplexor.

9. The digital frequency generator of claim 1, wherein the cyclic selection circuit generates a control signal to change the selection of one of the multiphase signals at a predetermined switching rate relative to a received pulse signal.

10. The digital frequency generator of claim 1, wherein said at least one internal component in said oscillator circuit is a gate having a propagation delay.

11. The digital frequency generator of claim 10, wherein said at least one gate is an inverter gate.

12. The digital frequency generator of claim 1, wherein said oscllator circuit has a plurality of internal components including a plurality of gates, said plurality of gates coupled in a continuous cascade arrangement, each gate producing an output which is delayed in phase relative to the preceding gate.

13. The digital frequency generator of claim 12, wherein each gate has a propagation delay.

14. The digital frequency generator of claim 12, wherein said plurality of gates are inverter gates.

15. A method of digital frequency generation, comprising:

generating a plurality of multiphase signals, each multiphase signal having a common predetermined frequency produced by at least one internal component in an oscillator circuit; and cyclically selecting at a controllable or predetermined rate, different ones of the plurality of multiphase signals for output, to thereby generate a clock output signal having a frequency different from the oscillator circuit frequency, the cyclic selection being performed at a rate determined by one or more of the multiphase signals;

wherein the output signal frequency $F_{OUT}$ is related to the oscillator circuit frequency $F_{OSC}$ by:

$$F_{OUT} = \left(\frac{N}{N \pm \left(\frac{R}{M}\right)}\right) \times F_{OSC}$$

where M and R are non-zero integers, and N=number of phases of said multiphase signals.

16. The method of claim 15, further comprising generating a control signal to change the selection at a predetermined switching rate relative to a received pulse signal.

17. The method of claim 15, further comprising dividing an output signal rate by a non-zero integer to determine the rate at which cyclic selection occurs.

18. The method of claim 15, further comprising enabling the oscillator circuit to be controlled using one or more components external to the oscillator circuit.

19. The method of claim 15, further comprising storing a value representing a respective signal to be selected by the multiplexor, said value to be stored in a register.

20. The method of claim 19, further comprising adjusting the value stored in the register by incrementing and/or decrementing said value by a programmable value, wherein said programmable value is a non-zero integer.

21. The method of claim 15, further comprising generating a periodic trigger signal from the output of the multiplexor.

22. An integrated circuit including a digital frequency generator, comprising:

an oscillator circuit having at least one internal component which produces multiphase signals;

a multiplexor for outputting a selected signal from the multiphase signals from the oscillator circuit; and a cyclic selection circuit driven by the selected signal and operable to control the multiplexor to vary cyclically the selection of the multiphase signals used as the selected signal, to thereby generate a clock output signal having a frequency different from the oscillator circuit frequency;

wherein the output signal frequency $F_{OUT}$ is related to the oscillator circuit frequency $F_{OSC}$ by:

$$F_{OUT} - \left(\frac{N}{N \pm \left(\frac{R}{M}\right)}\right) \times F_{OSC}$$

where M and R are non-zero integers, and N=number of phases of said multiphase signals.

23. The integrated circuit of claim 22, further comprising at least one connection for enabling the oscillator circuit to be controlled using one or more components external to the integrated circuit.

24. The integrated circuit of claim 22, wherein the cyclic selection circuit comprises at least one divider circuit.

25. The integrated circuit of claim 24, wherein the divider circuit is operable to divide a received pulse rate by a programmable value.

26. The integrated circuit of claim 22, wherein the oscillator circuit comprises a phase locked loop.

27. The integrated circuit of claim 22, wherein the oscillator circuit comprises a ring oscillator, the ring oscillator including a ring of controllable delay elements.

28. The integrated circuit of claim 22, wherein the cyclic selection circuit comprises a register for storing a value representing a respective signal to be selected by the multiplexor, and a circuit operable to increment and/or to decrement the value stored in the register by a programmable value, wherein said programmable value is a non-zero integer.

29. The integrated circuit of claim 22, wherein the cyclic selection circuit comprises a circuit for generating a periodic trigger signal from the output of the multiplexor.

30. The integrated circuit of claim 22, wherein the cyclic selection circuit generates a control signal to change the selection of one of the multiphase signals at a predetermined switching rate relative to a received pulse signal.

31. The integrated circuit of claim 22, further comprising at least one internal component in said oscillator circuit is a gate having a propagation delay.

32. The integrated circuit of claim 31, wherein said at least one gate is an inverter gate.

33. The integrated circuit of claim 22, wherein said oscillator circuit has a plurality of internal components including a plurality of gates, said plurality of gates coupled in a continuous cascade arrangement, each gate producing an output which is delayed in phase relative to the preceding gate.

34. The integrated circuit of claim 33, wherein each gate has a propagation delay.

35. The integrated circuit of claim 33, wherein said plurality of gates are inverter gates.

36. A digital frequency generator, comprising:
   an oscillator circuit with means for producing multiphase output pulse signals;
   a multiplexor for outputting a selected signal from the multiphase output pulse signals from the oscillator circuit; and
   a cyclic selection circuit driven by a signal from the oscillator circuit or from the multiplexor, and operable to control the multiplexor to vary cyclically the selection of the signal used as the output signal, to thereby generate an output signal having a frequency different from the oscillator frequency, wherein the multiphase oscillator comprises a ring oscillator,
wherein the output frequency $F_{OUT}$ is related to the frequency of the oscillator circuit $F_{OSC}$ by:

$$F_{OUT} = \left[ \frac{N}{N \pm \left(\frac{R}{M}\right)} \right] \times F_{OSC}$$

where M and R are non-zero integers, and N=number of phases of said multiphase output pulse signals.

37. A frequency generator according to claim 36, wherein the cyclic selection circuit comprises a divide-by-M division circuit for dividing a pulse rate by said value M.

38. A frequency generator according to claim 36, wherein the cyclic selection circuit comprises a register for storing a value representing a respective signal to be selected by the multiplexor, and a circuit operable to increment and/or to decrement the value stored in the register by said value R.

39. A frequency generator according to claim 36 wherein M=1.

40. A digital frequency generator, comprising:
   an oscillator circuit with means for producing multiphase output pulse signals;
   a multiplexor for outputting a selected signal from the plurality of multiphase pulse signals from the oscillator circuit; and
   a cyclic selection circuit driven by a signal from the oscillator circuit or from the multiplexor, and operable to control the multiplexor to vary cyclically the selection of the signal used as the output signal, to thereby generate an output signal having a frequency different from the oscillator frequency, the cyclic selection circuit comprising a circuit for receiving a pulse signal from the multiplexor or from the oscillator, and for generating a control signal to change the selection at a predetermined switching rate relative to the received pulse signal, said circuit comprising at least one divider circuit,
   wherein the divider circuit is operable to divide a received pulse rate by a programmable value M, and wherein the cyclic selection circuit comprises a register for storing a value representing a respective signal to be selected by the multiplexor, and a circuit operable to change the register value by a programmable value R.

41. A frequency generator according to claim 40, wherein said cyclic selection circuit comprises a circuit for generating a periodic trigger signal from the output of a switch means.

42. A frequency generator according to claim 40, wherein the oscillator circuit comprises a phase locked loop.

43. A frequency generator according to claim 40, wherein the oscillator circuit comprises a ring oscillator.

44. A frequency generator according to claim 43, wherein the ring oscillator comprises a ring of controllable delay elements.

45. A frequency generator according to claim 44, wherein the controllable delay elements have different inputs and outputs.

46. A frequency generator according to claim 40, wherein the output frequency $F_{OUT}$ is related to the frequency of the oscillator circuit $F_{OSC}$ by:

$$F_{OUT} = \left[ \frac{N}{N \pm \left(\frac{R}{M}\right)} \right] \times F_{OSC}$$

where M and R are non-zero integers, and N=number of phases of said multiphase output pulse signals, and wherein the cyclic selection circuit comprises a divide-by-M division circuit for dividing a pulse rate by said value M.

47. A frequency generator according to claim 46, wherein the cyclic selection circuit comprises a register for storing a value representing a respective signal to be selected by the multiplexor, and a circuit operable to increment and/or to decrement the value stored in the register by said value R.

48. A digital frequency generator, comprising:
   an oscillator circuit which produces multiphase output pulse signals;
   a multiplexor which outputs a selected signal from the multiphase output pulse signals; and
   a cyclic selection circuit driven by a signal from the multiplexor, and operable to control the multiplexor to vary cyclically the selection of the signal used as the output signal, to thereby generate an output signal having a frequency different from an oscillator frequency, the cyclic selection circuit comprising at least one divider circuit which receives a pulse signal from the multiplexor and generates a control signal to change the selection at a predetermined switching rate relative to a received pulse signal,
   wherein the output frequency FOUT is related to the frequency of the oscillator circuit $F_{OSC}$ by:

$$F_{OUT} = \left[\frac{N}{N \pm \left(\frac{R}{M}\right)}\right] \times F_{OSC}$$

where M and R are non-zero integers, and N=number of phases of said multiphase output pulse signals, and wherein the cyclic selection circuit comprises a divide-by-M division circuit which divides a pulse rate by the value M.

49. A frequency generator according to claim 48, wherein the cyclic selection circuit comprises a register which stores a value representing a respective signal to be selected by the multiplexor, and a circuit operable to increment and/or to decrement the value stored in the register by the value R.

50. A digital frequency generator, comprising:
an oscillator circuit with means for producing N multiphase output pulse signals;
a multiplexor for outputting a selected signal from the plurality of multiphase pulse signals from the oscillator circuit; and
a cyclic selection circuit driven by a signal from the oscillator circuit or from the multiplexor, and operable to control the multiplexor to vary cyclically the selection of the signal used as the output signal, to thereby generate an output signal having a frequency different from the oscillator frequency, the cyclic selection circuit comprising a circuit for receiving a pulse signal from the multiplexor or from the oscillator, and for generating a control signal to change the selection at a predetermined switching rate relative to the received pulse signal, said circuit comprising at least one divider circuit operable to divide a received pulse rate by a programmable value M,
wherein the cyclic selection circuit comprises a register for storing a value representing a respective signal to be selected by the mutiplexor, and a circuit operable to increment and/or to decrement the value stored by the register.

51. A digital frequency generator, comprising:
an oscillator circuit with means for producing N multiphase output pulse signals;
a multiplexor for outputting a selected signal from the plurality of multiphase pulse signals from the oscillator circuit; and
a cyclic selection circuit driven by a signal from the oscillator circuit or from the multiplexor, and operable to control the multiplexor to vary cyclically the selection of the signal used as the output signal, to thereby generate an output signal having a frequency different from the oscillator frequency, the cyclic selection circuit comprising a circuit for receiving a pulse signal from the multiplexor or from the oscillator, and for generating a control signal to change the selection at a predetermined switching rate relative to the received pulse signal, said circuit comprising at least one divider circuit operable to divide a received pulse rate by a programmable value M,
wherein the output frequency $F_{out}$ is related to the frequency of the oscillator circuit $F_{osc}$ by:

$$F_{OUT} = \left[\frac{N}{N \pm \left(\frac{R}{M}\right)}\right] \times F_{OSC}$$

where M and R are non-zero integers, and N=number of phases of said multiphase output pulse signals.

52. A digital frequency generator, comprising:
an oscillator circuit with means for producing N multiphase output pulse signals;
a multiplexor which outputs a selected signal from the multiphase output pulse signals, and a cyclic selection circuit driven by a signal from the multiplexor, and operable to control the multiplexor to vary cyclically the selection of the signal used as the output signal, to thereby generate an output signal having a frequency different from the oscillator frequency, the cyclic selection circuit comprising at least one divider circuit which receives a pulse signal from the multiplexor and generates a control signal to change the selection at a predetermined switching rate relative to the received pulse signal, wherein the divider circuit is operable to divide a received pulse rate by a programmable value,
wherein the cyclic selection circuit comprises a register which stores a value representing a respective signal to be selected by the multiplexor, and a circuit operable to increment and/or to decrement the value stored by the register.

53. A digital frequency generator, comprising:
an oscillator circuit with means for producing N multiphase output pulse signals;
a multiplexor which outputs a selected signal from the multiphase output pulse signals; and
a cyclic selection circuit driven by a signal from the multiplexor, and operable to control the multiplexor to vary cyclically the selection of the signal used as the output signal, to thereby generate an output signal having a frequency different from the oscillator frequency, the cyclic selection circuit comprising at least one divider circuit which receives a pulse signal from the multiplexor and generates a control signal to change the selection at a predetermined switching rate relative to the received pulse signal,
wherein the output frequency $F_{out}$ is related to the frequency of the oscillator circuit $F_{osc}$ by:

$$F_{OUT} = \left[\frac{N}{N \pm \left(\frac{R}{M}\right)}\right] \times F_{OSC}$$

where M and R are non-zero integers, and N=number of phases of said multiphase output pulse signals.

54. A digital frequency generator, comprising:
an oscillator circuit with means for producing N multiphase output pulse signals, wherein the oscillator circuit comprises a ring oscillator;
a multiplexor for outputting a selected signal from the plurality of multiphase pulse signals from the oscillator circuit; and
a cyclic selection circuit driven by a signal from the oscillator circuit or from the multiplexor, and operable to control the multiplexor to vary cyclically the selection of the signal used as the output signal, to thereby generate an output signal having a frequency different from the oscillator frequency, wherein the output frequency $F_{out}$ is a function of the frequency ($F_{osc}$) of the oscillator circuit, a non-zero integer R, and the number of phases (N) of said multiphase output clock.

55. A digital frequency generator, comprising:

an oscillator circuit with means for producing N multiphase output pulse signals;

a multiplexor for outputting a selected signal from the plurality of multiphase pulse signals from the oscillator circuit; and a cyclic selection circuit driven by a signal from the oscillator circuit or from the multiplexor, and operable to control the multiplexor to vary the selection of the signal used as the output signal, to thereby generate an output signal having a frequency different from the oscillator frequency;

wherein the output frequency $F_{OUT}$ is related to the frequency of the oscillator circuit $F_{osc}$ by:

$$F_{OUT} = \left[\frac{N}{N \pm \left(\frac{R}{M}\right)}\right] \times F_{OSC}$$

where M and R are non-zero integers, and N=number of phases of said multiphase output pulse signals.

* * * * *